Feb. 10, 1970 N. BOCK ET AL 3,494,024

MASS PRODUCTION OF SEMICONDUCTOR DEVICES

Filed Oct. 17, 1966 3 Sheets-Sheet 1

INVENTORS
Norbert Bock &
Walter Klossika
BY Spencer & Kaye
ATTORNEYS

MASS PRODUCTION OF SEMICONDUCTOR DEVICES

Filed Oct. 17, 1966 3 Sheets-Sheet 2

INVENTORS
Norbert Bock &
Walter Klossika

BY Spencer & Kaye
ATTORNEYS

MASS PRODUCTION OF SEMICONDUCTOR DEVICES

Filed Oct. 17, 1966 3 Sheets-Sheet 3

INVENTORS
Norbert Böck &
Walter Klossika
BY Spencer & Kaye
ATTORNEYS

United States Patent Office 3,494,024
Patented Feb. 10, 1970

3,494,024

MASS PRODUCTION OF SEMICONDUCTOR DEVICES

Norbert Böck and Walter Klossika, Heilbronn, Germany, assignors to Telefunken Patentverwertungsgesellschaft m.b.H., Ulm, Donau, Germany Filed Oct. 17, 1966, Ser. No. 587,103
Claims priority, application Germany, Oct. 19, 1965, T 29,608
Int. Cl. B01j *17/00;* H01l *7/02*
U.S. Cl. 29—589 13 Claims

ABSTRACT OF THE DISCLOSURE

A method for mass producing planar semiconductor devices by providing a support body composed of a plurality of separable support portions, disposing metallic contacting islands which are electrically isolated from one another on each support portion, disposing a planar semiconductor element on one island of an associated support portion, connecting the body of the semiconductor element to the island on which it is mounted and the other semiconductor regions of the element to other islands associated with the same support portion, connecting an external lead to each contacting island, and separating the support portions from one another.

The present invention relates to the mass production of semiconductor devices, and particularly to a mass production process in which a large number of such devices are fabricated on a large, one-piece support body.

Many techniques have already been proposed for mass producing semiconductor devices. According to one such technique, a plurality of devices is fabricated by mounting a plurality of semiconductor elements in line on metallic, ladder-shaped contacting strips. The number of contacting rungs, or rung portions, provided on the strips is equal to the number of electrodes to be contacted and the semiconductor element itself is soldered to one of the rungs, while the other electrodes of the element are conductively connected to adjacent rungs by thin wires. After the contacts have been made, one side piece of the ladder-shaped arrangement is removed and the semiconductor devices are encapsulated by immersion of the strips into a plastic material.

Although this method yields generally satisfactory results, it still presents several drawbacks. For example, the danger exists that during the fabrication process the very thin metal strips will become bent or broken. This danger is particularly great in those cases where some of the rungs are separated into two portions, each portion being provided for contacting a different electrode. In addition, since all of the rungs remain electrically connected together until after they have been welded to the external lead pins of a transistor base, or header, the semiconductor element electrodes will remain short-circuited together until the end of the fabrication process, so that they can not be electrically tested until the fabrication process has been completed.

According to another fabrication technique which has been recently suggested, a support body of insulating material is provided with contacting islands and is mounted on a support base, or header. A semiconductor element having all of its electrodes projecting from one planar surface is then mounted so that each electrode directly contacts a respective contacting island. The electrodes are then directly connected to the contacting islands, without requiring any intermediate thin electrode lead wires. This method is particularly advantageous for the production of small numbers of semiconductor devices. However, it is not well suited to mass production procedures because a separate body of insulating material must be provided for each header.

It is a primary object of the present invention to overcome these drawbacks and limitations.

A more specific object of the present invention is to combine the advantages of the above-described techniques, while eliminating their drawbacks.

A further object of the present invention is to produce a large number of semiconductor devices in a simple and inexpensive manner.

A yet further object of the present invention is to produce a large number of semiconductor elements in a manner which yields a relatively small number of rejects.

A still further object of the present invention is to produce a large number of semiconductor elements which can be electrically tested during substantially every stage of the fabrication process.

These and other objects according to the present invention are achieved by a novel method for mass-producing semiconductor devices starting with a planar support body made of insulating material and having a plurality of separable semiconductor element support portions. The method includes the steps of disposing a plurality of metallic contacting islands, one for each connection to be made to a semiconductor element, on each support portion, each island being electrically isolated from the remaining islands, disposing a semiconductor element on each support portion, and conductively connecting each semiconductor element region to be contacted in a barrier layer-free manner to a respective island of an associated support portion. Then, the body is separated into individual support portions each carrying one semiconductor element. The present invention also includes the intermediate product of the above method, prior to the separation of the body 1 into individual portions.

In further accordance with the method of the present invention, each support portion is provided with a plurality of holes or recesses, each bordered by a respective island, and an external lead pin is inserted in each hole or recess and soldered to the island adjacent thereto.

Additional objects and advantages of the present invention will become apparent upon consideration of the following description when taken in conjunction with the accompanying drawings in which.

Figures 1, 2, 3:
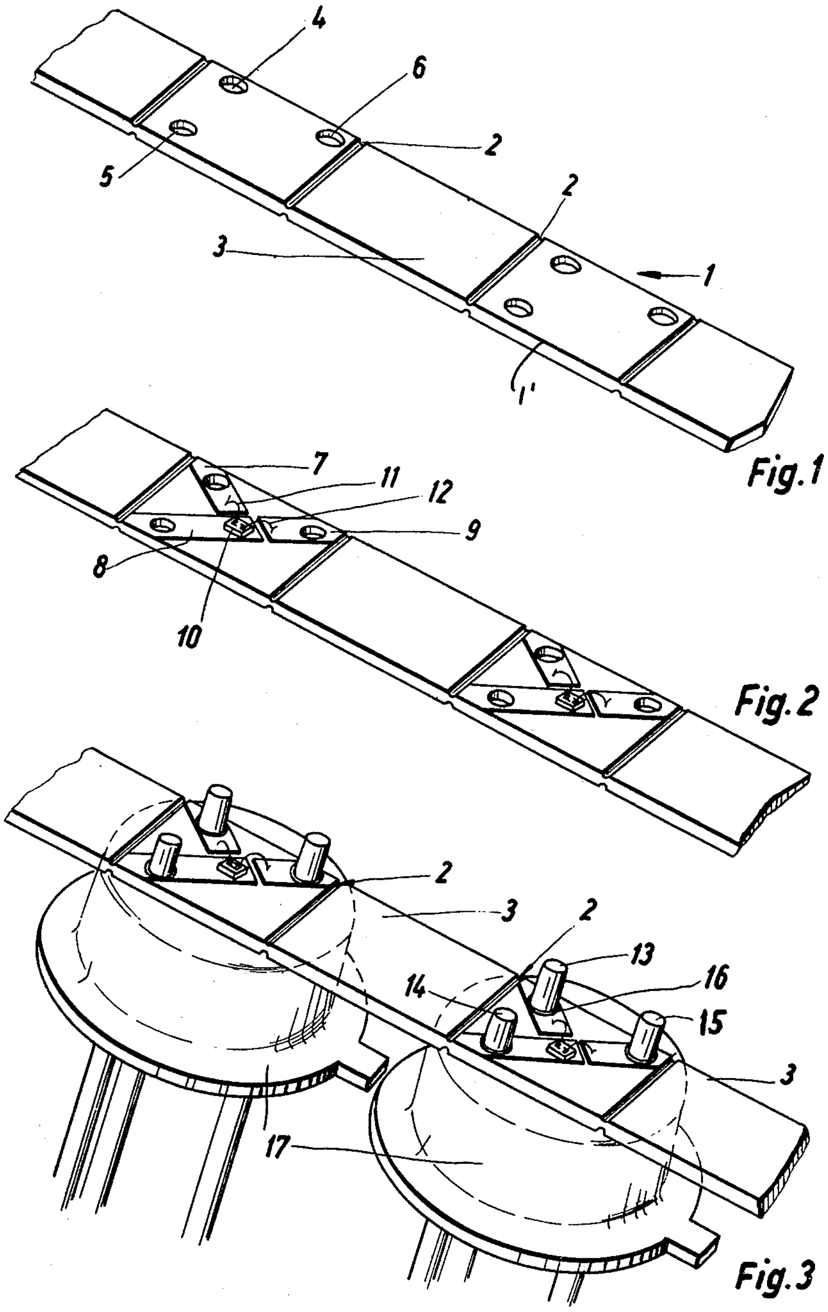
FIGURE 1 is a perspective view showing the starting element for use in one embodiment of the method of the present invention.
FIGURE 2 is a perspective view showing an intermediate stage in the first embodiment of the method of the present invention.
FIGURE 3 is a perspective view showing a final stage of the first embodiment of the method of the present invention.

Referring first to the process illustrated in FIGURES 1, 2, 3, FIGURE 1 shows a strip-shaped intermediate support body 1 having a plurality of support portions 1' and a plurality of connecting portions 3. Each connecting portion 3 is interposed between, and connects, two successive support portions 1' so as to form a succession of alternating support portions and connecting portions extending in a straight line. The support portions 1' initially form a single strip with the connecting portions 3 primarily in order to facilitate the handling of the support portions during fabrication.

The boundary between each adjacent pair of portions is defined by laterally extending grooves 2. Each boundary is preferably defined by two such grooves, one in each surface of the strip 1. These grooves serve a multiplicity of purposes in that they are employed to correctly position the strip during each stage of the fabrication process and to permit the support portions to be readily separated from the connecting portions at an appropriate stage of the fabrication process. The depth of the grooves 2 is chosen so as to afford a good support of the various portions during each phase of the fabrication process, particularly when the strip is carried by a carrier having positioning ridges which match these grooves. The grooves 2 are preferably formed by etching or milling.

The strip 1 is preferably made of a ceramic material, such as beryllium oxide or other suitable insulating material having good heat dissipation properties. When the strip is made of such material, the grooves 2 are preferably formed in the soft ceramic mass before it is baked. When the strip 1 is fabricated by a casting process, the casting mold is preferably shaped to form the grooves 2.

Each support portion of the strip 1 is provided with a plurality of holes for the insertion of external electrode lead pins. When the strip is to be used, for example, for the fabrication of transistors, each support portion will be provided with three holes 4, 5, and 6. Prior to the insertion of electrode lead pins into these holes, the holes can be advantageously used as positioning elements to assist the accurate positioning of the strip during the initial production stages.

After the support body 1 has been given the form shown in FIGURE 1, and has preferably been placed on a suitable carrier, each support portion 1' is provided with metallic contacting islands 7, 8, and 9, as shown in FIGURE 2. Each island surrounds a respective one of the lead pin holes 4, 5, and 6. Islands 7, 8, and 9 may be applied in any known manner, such as by vapor deposition, electrodeposition, or printing. The islands are generally made of gold or one of its alloys, or aluminum, the selection of the material being based primarily on the requirements that it be capable of being connected to the semiconductor elements and electrodes at as low a temperature as possible and without the formation of any interposed barrier layer.

After the islands 7, 8, and 9 have been deposited, a semiconductor wafer, or element, 10 containing a transistor and, for example, being of the conductivity type of the transistor collector, is soldered to the contacting island 8 and the other electrodes of the semiconductor element, i.e. the base and emitter electrodes, are conductively connected by means of thin lead wires 11 and 12, respectively, to the corresponding islands 7 and 9, by thermocompression for example.

Then, as is illustrated in FIGURE 3, the strip 1 is assembled with a plurality of transistor headers 17, each carrying three lead pins, 13, 14, and 15, in such a manner that each of these pins is slipped through a respective one of the holes 4, 5, and 6, and each support portion 1' rests on the upper surface of its associated header. Each of the pins 13, 14, and 15 is then soldered to its associated island. This soldering operation can be carried out by slipping a small washer 16 of solder material over each pin and onto the associated island and by passing the entire arrangement through a continuous-heating furnace.

The individual semiconductor devices can then be separated by means of an appropriate punching device, or by cutting or sawing the strip 1 along the grooves 2, or by breaking the connecting portions away along the grooves 2. The resulting individual semiconductor devices can then each be provided with a can and hermetically sealed so as to be ready for use.

In order for the process of the present invention to be employed for manufacturing transistors comparable in size to other current types of transistors, the strip 1 might have a width of the order of 4 millimeters and might be provided with holes 4, 5, and 6 each having a diameter of the order of 0.5 millimeter.

Figures 4, 5:
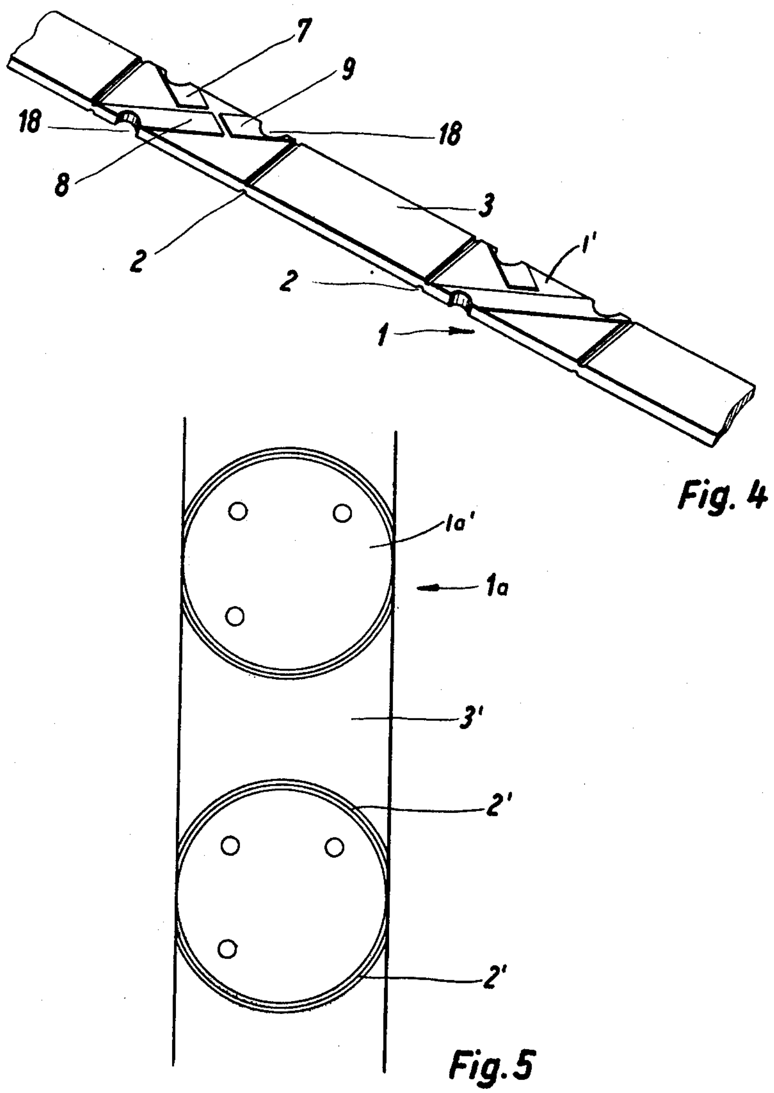
FIGURE 4 is a perspective view of a modified version of the element of FIGURE 1.
FIGURE 5 is a plan view of another form of construction of the element of FIGURE 1.

The fabrication process according to the present invention can be simplified by employing an intermediate support body in the form of the strip 1 of FIGURE 4 in which the holes 4, 5, and 6 are eliminated and their function is fulfilled by recesses, or notches, 18 formed in the sides of each support portion 1'. Each of the notches 18 is positioned so as to border, and preferably so as to be contiguous with, a respective one of the contacting islands 7, 8, and 9.

It will be appreciated that notches 18 are somewhat easier to produce than the relatively small holes 4, 5, and 6, since these notches can be formed either by milling or by pressing into the soft ceramic mass from which the strip 1 is to be made. In addition, the provision of lateral notches 18 in place of the holes 4, 5, and 6, permits the strip of FIGURE 4 to be made narrower than the strip of FIGURES 1 to 3.

As in the process described in connection with FIGURES 1 to 3, each contacting island of the FIGURE 4 arrangement can be connected to a respective lead pin by disposing each lead pin in one of the recesses 18 and then soldering the pin to the bordering contacting island.

Turning now to FIGURE 5, there is shown another form which the intermediate support body can take. This figure shows a support body 1*a* having substantially circular support portions 1*a'* and interposed connecting portions 3'. The boundary between each connecting portion 3' and each immediately adjacent support body 1*a'* is defined by at least one substantially semicircular groove 2', there preferably being one such groove in each surface of the body 1*a*. This configuration permits each support portion 1*a'* to conform more closely to the shape of the headers 17 of FIGURE 3 and eliminates overhanging edges and corners whose presence might hamper the fabrication process. After the strip 1*a* has been assembled with a plurality of headers and the lead pins have been soldered in place, the connecting portions 3' can be removed simply by knocking them out.

Figure 6:
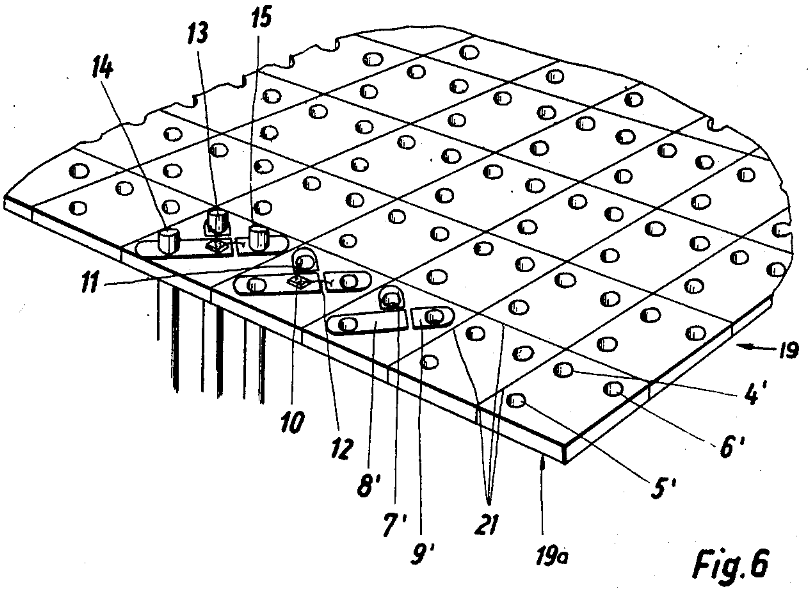
FIGURE 6 is a perspective view of a starting element used in a second embodiment of the method of the present invention.
Figures 7, 8:
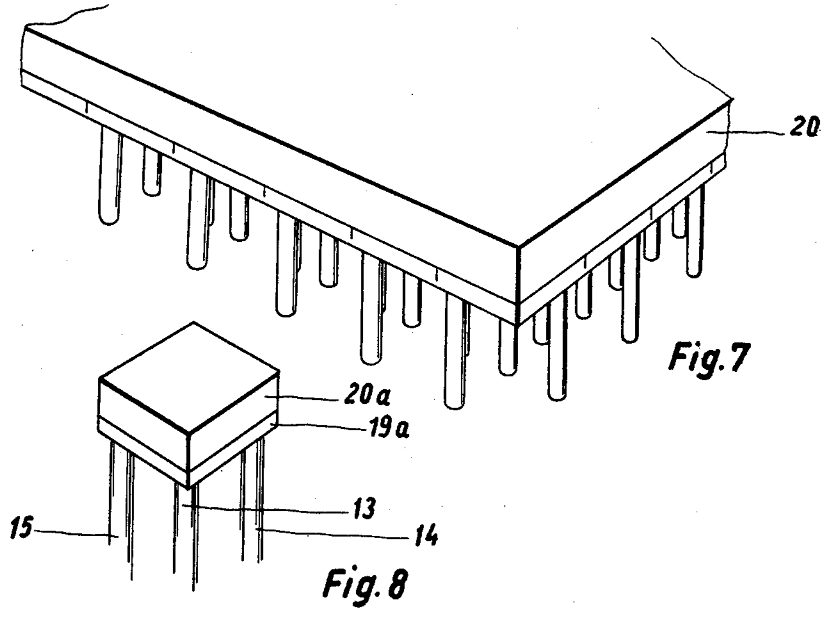
FIGURE 7 is a perspective view of an intermediate stage of the second embodiment of the method of the present invention.
FIGURE 8 is a perspective view of a final stage of the embodiment of the method to which FIGURES 6 and 7 relate.

FIGURES 6, 7, and 8 show three stages in a further embodiment of the method according to the present invention in which the intermediate support body is originally present in the form of a flat plate 19 having a plurality of support portions 19*a* arranged in a rectangular pattern.

As is shown in FIGURE 6, no connecting portions are provided and the plate 19 is composed entirely of support portions 19*a*, the boundaries between adjacent support portions being delimited by separating lines 21. Etched or milled grooves could also be provided in place of the lines 21. Each support portion 19*a* is provided with a plurality of holes, three holes 4', 5', and 6' being provided in the case where a transistor is to be mounted on each support portion. Then, each support portion is provided with three metallic contacting islands 7', 8', and 9', each island surrounding a respective one of the holes. Subsequently, a semiconductor body 10 containing a transistor is soldered in a barrier layer-free manner to each contacting island 8' and each of the two transistor electrodes is conductively connected to a respective one of the islands 7' and 9' by means of thin electrode lead wires 11 and 12, respectively, the wires being attached to the islands by thermo-compression, for example.

Then, external lead pins 13, 14, and 15 are passed through the holes 4', 5', and 6', respectively, of each support portion. In this embodiment, the pins 13, 14, and 15 are not carried by a header and are supported only by the support portions 19*a* so that these support portions will serve as the sole support base for the resulting transistor assembly.

Solder washers are then placed around each of the lead pins and in contact with the associated contacting islands and the entire arrangement is passed, for example, through a continuous-heating furnace in which the pins are soldered to the contacting islands.

Subsequently, the upper surface of the plate 19 is coated with a layer 20 of a plastic, such as epoxy resin, as is shown in FIGURE 7. The layer 20 acts as a potting for protecting the resulting transistor assemblies from all outside influences. The resulting arrangement is then divided along the lines 21 in order to yield a plurality of transistors, one of which is shown in FIGURE 8. As may be seen from FIGURE 8, each transistor is composed of three lead pins 13, 14, and 15, a support portion 19*a*, and a potting layer 20*a*.

The method illustrated in FIGURES 6 to 8 is particularly well suited for the production of extremely small transistors, primarily because the external lead pins 13, 14, and 15 are not mounted in a header and are supported only by their respective support portions 19*a*.

The method of the present invention can be applied to the manufacture of all types of semiconductor devices, including integrated circuits; it only being necessary for each of the support portions of the intermediate support strip or plate to be provided with a number of contacting islands and associated lead pin holes or recesses equal to the number of connections which must be made to the semiconductor element.

The process of the present invention can be further simplified so as to eliminate the need for thin lead wires between the semiconductor element electrodes and the contacting elements. This can be accomplished, for example, by fabricating each semiconductor element so that all of its electrodes project from a single planar surface of the element, by placing the element so that each electrode directly contacts a respective contacting island, and by then soldering each electrode to its associated island.

It has been found that one of the major advantages of the semiconductor mass production method according to the present invention resides in the fact that it results in a relatively low number of rejects. This is due primarily to the fact that the intermediate support body on which the various process steps are carried out is relatively sturdy. Moreover, with the exception of the thin electrode lead wires 11 and 12, none of the component parts of the assembly are delicate or easily damaged. The low number of rejects resulting from the method of the present invention is also due to the fact that the electrical connections made during fabrication are well protected against bending or breakage during the entire process.

Another major advantage of the present invention resides in the fact that the external lead pins need only be soldered to the contacting islands disposed on the intermediate support body, whereas in the prior art methods utilizing ladder-shaped contacting strips, the rungs of these strips had to be welded to the external lead pins.

According to a further major advantage of the present invention, the contacting islands on each support portion are never short-circuited together. As a result, the attached semiconductor elements can be electrically tested during any stage of the fabrication process.

It may thus be seen that the present invention provides a novel method for mass producing a large number of semiconductor devices in a simpler, less expensive, and more reliable manner than has been heretofore possible.

It will be understood that the above description of the present invention is susceptible to various modifications, changes, and adaptations, and the same are intended to be comprehended within the meaning and range of equivalents of the appended claims.

What is claimed is:

1. A method for mass producing semiconductor devices starting with a planar support body in the form of a flat plate made of insulating material and composed of a plurality of separable semiconductor element support portions, each portion having a plurality of lead-receiving passages formed therein, comprising the steps of:

(a) disposing a plurality of metallic contacting islands, one for each connection to be made to a semiconductor element, on only one surface of each support portion, each island being electrically isolated from the remaining islands and bordering on a respective passage;

(b) placing an external lead in each passage and conductively attaching each lead to the island bordering its respective passage so that each lead is supported exclusively by its associated support portion;

(c) disposing a planar semiconductor element on such one surface of each support portion;

(d) conductively connecting each semiconductor element region to be contacted in a barrier layer-free manner to a respective island of its associated support portion;

(e) coating the resulting assembly with an encapsulating layer after conductively connecting the semiconductor elements and leads; and (f) separating the body, after said coating step, into individual support portions each carrying one semiconductor element.

2. A method for mass producing semiconductor devices starting with a planar support body made of insulating material and composed of a plurality of separable semiconductor element support portions, each portion having a plurality of lead-receiving passages formed therein, comprising the steps of:

(a) disposing a plurality of metallic contacting islands, one for each connection to be made to a semiconductor element, on only one surface of each support portion by vapor depositing such islands on each support portion, each island being electrically isolated from the remaining islands and bordering on a respective passage;

(b) placing an external lead in each passage and conductively attaching each lead to the island bordering its respective passage;

(c) disposing a planar semiconductor element on such one surface of each support portion;

(d) conductively connecting each semiconductor element region to be contacted in a barrier layer-free manner to a respective island of its associated support portion; and (e) separating the body into individual support portions each carrying one semiconductor element.

3. A method as defined in claim 2 wherein the support body is in the form of a narrow strip whose support portions extend in a line along the strip.

4. A method as defined in claim 3 wherein the support body further includes a plurality of connecting portions, each interposed between two successive support portions, and said step of separating each body into individual support portions is carried out by breaking the connecting portions away from their immediately adjacent support portion.

5. A method as defined in claim 4 wherein the strip is provided with at least one groove defining the boundary between successive portions for facilitating the removal of the connecting portions from the support portions.

6. A method as defined in claim 5 wherein the external leads associated with each support portion are carried by a transistor header, and the grooves are shaped to cause each support portion to conform to the shape of its associated header.

7. A method as defined in claim 1 wherein the plate carries a plurality of rows of support portions.

8. A method as defined in claim 1 wherein the encapsulating layer is constituted by an epoxy resin.

9. A method as defined in claim 1 wherein the support body is made of ceramic material.

10. A method as defined in claim 9 wherein the ceramic material is beryllium oxide.

11. A method as defined in claim 9 further comprising the preliminary step of forming the support body by shaping a soft, unbaked ceramic mass into the form of the support body, forming a plurality of passages for receiving external leads in the unbaked ceramic mass, and baking the mass to produce a rigid support body.

12. A method for mass producing semiconductor devices starting with a planar support body made of insulating material and composed of a plurality of separable semiconductor element support portions, each portion having a plurality of lead-receiving passages formed therein, comprising the steps of:

(a) disposing a plurality of metallic contacting islands, one for each connection to be made to a semiconductor element, on only one surface of each support portion, by printing such islands on each support portion, each island being electrically isolated from the remaining islands and bordering on a respective passage;

(b) placing an external lead in each passage and conductively attaching each lead to the island bordering its respective passage;

(c) disposing a planar semiconductor element on such one surface of each support portion;

(d) conductively connecting each semiconductor element region to be contacted in a barrier layer-free manner to a respective island of its associated portion; and (e) separating the body into individual support portions, each carrying one semiconductor element.

13. A method for mass producing semiconductor devices starting with a planar support body made of insulating material and composed of a plurality of separable semiconductor element support portions, each portion having a plurality of lead-receiving passages formed therein, comprising the steps of:

(a) disposing a plurality of metallic contacting islands, one for each connection to be made to a semiconductor element, on only one surface of each support portion by electrodeposition, each island being electrically isolated from the remaining islands and bordering on a respective passage;

(b) placing an external lead in each passage and conductively attaching each lead to the island bordering its respective passage;

(c) disposing a planar semiconductor element on such one surface of each support portion;

(d) conductively connecting each semiconductor element region to be contacted in a barrier layer-free manner to a respective island of its associated support portion; and (e) separating the body into individual support portions each carrying one semiconductor element.

References Cited

UNITED STATES PATENTS

| | | | |
|---|---|---|---|
| 2,804,581 | 8/1957 | Lichtgarn | 29—578 |
| 3,021,461 | 2/1962 | Oakes. | |
| 3,030,562 | 4/1962 | Maiden et al. | |
| 3,159,775 | 12/1964 | Ingraham | 29—630 X |
| 3,255,511 | 6/1966 | Weissenstern | 29—589 |
| 3,264,712 | 8/1966 | Hayashi et al. | 29—589 |
| 3,360,852 | 1/1968 | Cochran | 29—624 |

PAUL M. COHEN, Primary Examiner

U.S. Cl. X.R.

29—577, 578, 590, 591